(12) United States Patent
Hu et al.

(10) Patent No.: US 10,256,211 B2
(45) Date of Patent: Apr. 9, 2019

(54) MULTI-CHIP-MODULE SEMICONDUCTOR CHIP PACKAGE HAVING DENSE PACKAGE WIRING

(71) Applicant: INTEL CORPORATION, Santa Clara, CA (US)

(72) Inventors: Chuan Hu, Chandler, AZ (US);
Chia-Pin Chiu, Tempe, AZ (US);
Johanna Swan, Scottsdale, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 14/655,688

(22) PCT Filed: Jul. 28, 2014

(86) PCT No.: PCT/US2014/048510
§ 371 (c)(1),
(2) Date: Jun. 25, 2015

(87) PCT Pub. No.: WO2016/018237
PCT Pub. Date: Feb. 4, 2016

(65) Prior Publication Data
US 2016/0293578 A1    Oct. 6, 2016

(51) Int. Cl.
*H01L 23/00* (2006.01)
*H01L 25/065* (2006.01)
(Continued)

(52) U.S. Cl.
CPC ........ *H01L 25/0655* (2013.01); *H01L 21/486* (2013.01); *H01L 21/4853* (2013.01);
(Continued)

(58) Field of Classification Search
CPC ... H01L 21/4853; H01L 21/486; H01L 22/32; H01L 23/49811; H01L 23/49827; H01L 25/0655; H01L 2224/7511
See application file for complete search history.

(56) References Cited

U.S. PATENT DOCUMENTS

| | | |
|---|---|---|
| 6,271,469 B1 * | 8/2001 | Ma .................. H01L 21/56 174/521 |
| 7,476,563 B2 | 1/2009 | Mangrum et al. |

(Continued)

FOREIGN PATENT DOCUMENTS

| | | |
|---|---|---|
| CN | 1555574 A | 12/2004 |
| CN | 103715151 A | 4/2014 |

(Continued)

OTHER PUBLICATIONS

The International Search Report and Written Opinion dated Apr. 23, 2014, in related matter No. P64909PCT (PCT/US2014/048510), 11 pages total.

(Continued)

*Primary Examiner* — Mounir Amer
*Assistant Examiner* — Alexander Belousov
(74) *Attorney, Agent, or Firm* — Schwabe, Williamson & Wyatt P.C.

(57) ABSTRACT

An apparatus is described having a build-up layer. The build-up layer has a pad side of multiple die pressed into a bottom side of the build-up layer. The multiple die have wide pads to facilitate on wafer testing of the multiple die. The wide pads are spaced a minimum distance permitted by a manufacturing process used to manufacture their respective die. The build-up layer above the wide pads is removed. The apparatus also includes metallization on a top side of the build-up layer that substantially fills regions above the wide (Continued)

pads. The metallization includes lands above the wide pads and multiple wires between the wide pads.

21 Claims, 8 Drawing Sheets

(51) Int. Cl.
*H01L 25/00* (2006.01)
*H01L 23/31* (2006.01)
*H01L 21/56* (2006.01)
*H01L 23/538* (2006.01)
*H01L 21/48* (2006.01)
*H01L 23/498* (2006.01)

(52) U.S. Cl.
CPC ........ *H01L 21/568* (2013.01); *H01L 23/3128* (2013.01); *H01L 23/49811* (2013.01); *H01L 23/5389* (2013.01); *H01L 24/19* (2013.01); *H01L 24/20* (2013.01); *H01L 24/96* (2013.01); *H01L 25/50* (2013.01); *H01L 23/49816* (2013.01); *H01L 23/49827* (2013.01); *H01L 2224/12105* (2013.01); *H01L 2924/1431* (2013.01); *H01L 2924/1434* (2013.01); *H01L 2924/1436* (2013.01); *H01L 2924/1438* (2013.01); *H01L 2924/3511* (2013.01)

(56) References Cited

U.S. PATENT DOCUMENTS

| | | | |
|---|---|---|---|
| 7,670,859 B2 | 3/2010 | Hanaoka | |
| 8,431,441 B2 | 4/2013 | Chino | |
| 2010/0213599 A1 | 8/2010 | Watanabe et al. | |
| 2011/0110061 A1 | 5/2011 | Leung et al. | |
| 2011/0156237 A1* | 6/2011 | Gulpen | H01L 21/568 257/692 |
| 2011/0198762 A1 | 8/2011 | Scanlan | |
| 2012/0032347 A1 | 2/2012 | Chang | |
| 2013/0234322 A1 | 9/2013 | Pendse | |
| 2013/0330881 A1 | 12/2013 | Park et al. | |
| 2014/0035163 A1 | 2/2014 | Khan | |
| 2014/0091472 A1* | 4/2014 | Honma | H01L 24/19 257/773 |
| 2014/0159228 A1 | 6/2014 | Teh | |
| 2014/0175636 A1 | 6/2014 | Roy et al. | |
| 2014/0182987 A1 | 7/2014 | Lee et al. | |
| 2014/0191406 A1 | 7/2014 | Takashita et al. | |
| 2014/0312511 A1* | 10/2014 | Nakamura | H01L 25/065 257/777 |
| 2016/0027754 A1* | 1/2016 | Katagiri | H01L 23/49816 257/737 |

FOREIGN PATENT DOCUMENTS

| | | |
|---|---|---|
| JP | H 09-172137 | 6/1997 |
| JP | 10-294422 | 4/1998 |
| JP | 10-284538 A | 10/1998 |
| JP | 2001-015637 | 1/2001 |
| JP | 2004-281898 | 10/2004 |
| JP | 2006-100710 | 4/2006 |
| JP | 2007-115957 | 5/2007 |
| JP | 2010510665 | 4/2010 |
| JP | 2010-219489 A | 9/2010 |
| JP | 2010-232616 | 10/2010 |
| JP | 2013-511137 | 3/2013 |
| JP | 2014-123775 | 7/2014 |
| WO | WO 2011/080672 | 7/2011 |
| WO | 2013/057949 A2 | 4/2013 |
| WO | WO 2013/069798 | 5/2013 |

OTHER PUBLICATIONS

Notification Concerning Transmittal of International Preliminary Report on Patentability issued for International Patent Application No. PCT/US2014/048510, dated Feb. 9, 2017.
Extended European Search Report for EP 14873106, dated Mar. 5, 2018, 11 pages.
Office Action from Chinese Patent Application No. 201480003718.4, dated Nov. 3, 2017, 22 pages.
Office Action from Chinese Patent Application No. 201480003718.4, dated Jul. 7, 2018, 29 pages.
Notice of Allowance from Japanese Patent Application No. 2016-538925, dated Oct. 24, 2018, 2 pages.
Office Action from Japanese Patent Application No. 2016-538925, dated Sep. 20, 2016, 5 pages.
Office Action from Japanese Patent Application No. 2016-538925, dated Mar. 14, 2017, 2 pages.
Office Action from Korean Patent Application No. 10-2015-7017262, dated Sep. 13, 2016, 13 pages.
Office Action from Korean Patent Application No. 10-2015-7017262, dated Jan. 6, 2017, 6 pages.
Office Action from Korean Patent Application No. 10-2015-7017262, dated Mar. 10, 2017, 14 pages.
Office Action from Taiwan Patent Application No. 104120577.0, dated May 27, 2016, 9 pages.
Notice of Allowance from Taiwan Patent Application No. 104120577.0, dated Mar. 30, 2017, 3 pages.

* cited by examiner

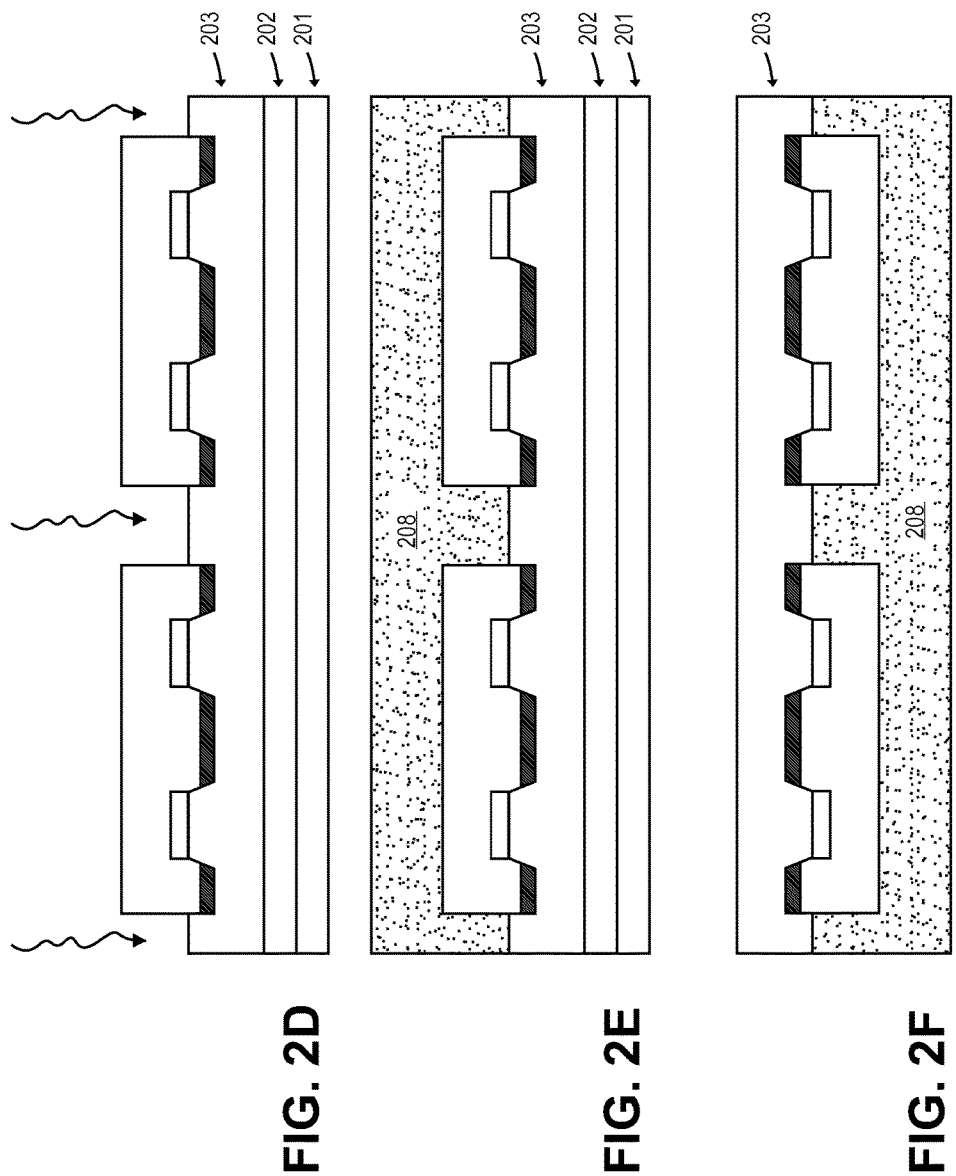

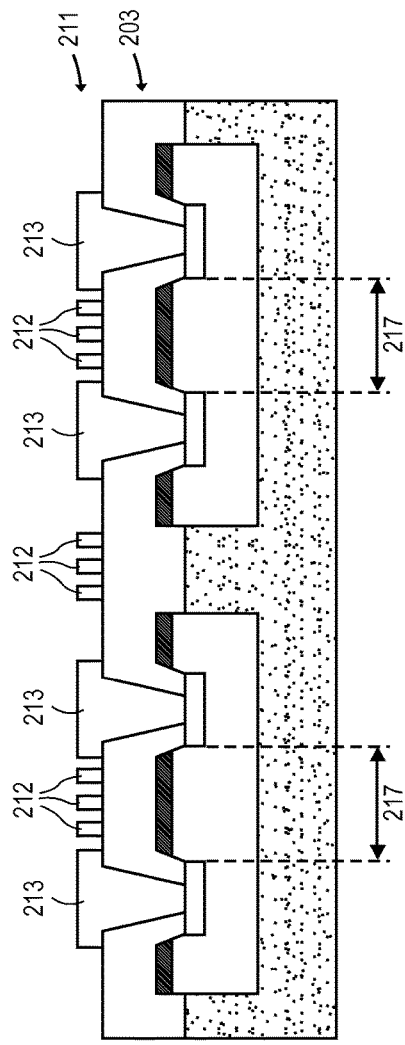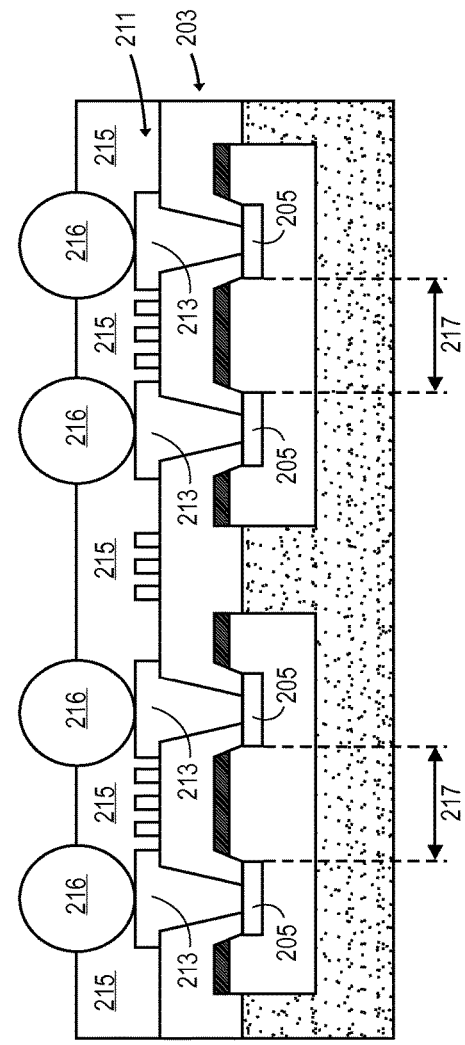
FIG. 2I
FIG. 2J

MULTI-CHIP-MODULE SEMICONDUCTOR CHIP PACKAGE HAVING DENSE PACKAGE WIRING

CROSS-REFERENCE TO RELATED APPLICATIONS

This patent application is a U.S. National Phase Application under 35 U.S.C. § 371 of International Application No. PCT/US2014/048510, filed Jul. 28, 2014, entitled A MULTI-CHIP-MODULE SEMICONDUCTOR CHIP PACKAGE HAVING DENSE PACKAGE WIRING and is hereby incorporated by reference.

FIELD OF INVENTION

The field of invention pertains generally to semiconductor chip packaging, and, more importantly, to a multi-chip-module semiconductor chip package having dense package wiring.

DETAILED DESCRIPTION

Multi-chip modules (MCM) are singular chip packages that contain more than one semiconductor chips. Successfully integrating multiple semiconductor chips into a single package presents technical challenges as well as cost issues. Some of these are observed in the prior art MCM that is depicted in FIG. 1a.

FIG. 1a shows a prior art MCM 100 having a pair of semiconductor die 101_1 and 101_2. The top surface of each die includes exposed pads 102 and a passivation layer 103. As observed in FIG. 1, a layer of metallization 104 is patterned over each die 101_1, 101_2. The metallization layer 104 provides for wiring traces 105 that can be formed between the die 101_1, 101_2 to electrically couple them and/or between a die and a solder ball 106 to form an I/O of the package. FIG. 1b shows a cross section in a direction orthogonal to the depiction of FIG. 1a to show interconnection of wiring traces to pads 102. Through such interconnection pads of a same die or pads of different die may be connected through wiring traces 105.

Notably, the die have wide pads 102 (e.g., at least 40 μm across) in order to promote functional testing of the die while in wafer form before dicing. By testing the die before they are integrated into the package the cost of packaging "bad" die is greatly reduced. However, the large pad sizes correspond to reduced wiring density within the package between the die.

Specifically, the wide pads 102 result in the creation of wide vias 107 and corresponding lands 113 which, in turn, limits the space available between lands 113 for wiring traces 105. As observed in FIG. 1a, there is room for only one wiring trace between lands 113. The limited wiring space between the lands 113 ultimately limits the number of chip-to-chip wires and/or the I/O density of the package. Either may correspond to an impractical solution (e.g., where dense wiring between chips is needed and/or dense package I/Os are needed, or larger size of semiconductor die is needed).

Reducing the die pad size to permit the formation of smaller vias and increased wiring density between lands 113 is not really an option as that would prohibit on wafer testing resulting in increased risk of fully packaging bad die.

FIGURES

A better understanding of the present invention can be obtained from the following detailed description in conjunction with the following drawings, in which:

FIGS. 1a-b shows a prior art multi-chip package.

FIGS. 2a-2k shows a process for manufacturing an improved multi-chip package;

DETAILED DESCRIPTION

FIGS. 2a through 2k a describe a process for forming an improved MCM that provides for increased wiring density between lands above vias that contact wide die pads. The process can be implemented, for example, as a wafer level process or a panel-level process. Because the die have wide pads the die can be functionally tested on wafer prior to packaging thereby reducing the risk of fully packaging bad die. Additionally, the increased wiring density between lands permits for increased wiring between die and/or increased package I/O density.

Figure 2A:
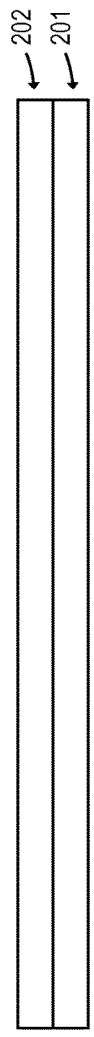

As observed in FIG. 2a and adhesion layer 202 is applied to a carrier 201. The carrier 201 can be any firm structure having a planar surface for application of the adhesion layer 202. As will be described in more detail below, a characteristic of the adhesion layer 202 is that it is reasonably easy to "de-laminate" or otherwise be removed from the surface of the carrier 201. In various embodiments the adhesion layer 202 is a polymer or polymer-like substance.

Figure 2B:
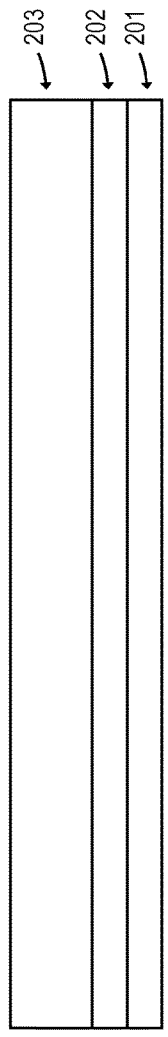

As observed in FIG. 2b a build-up layer 203 is applied to the surface of the adhesion layer 202. As will be described in more detail below, the thickness of the build-up layer is of some importance in realizing at least some of the improvements that the present description seeks to help realize. The build-up layer 203 may either be applied in a liquid phase and spun on the adhesion layer/carrier structure to the appropriate thickness, or, applied in a more solid phase such as a dry thin film (control of dry thin film thickness is well understood in the art).

Some examples for the build-up layer material 203 are polyimide, epoxy, acrylic, low k materials (e.g., B-staged bisbenzocyclobutene (BCB), silicone and polybenzoxazoles (PBO). As will be discussed in more detail below, the build-up layer 203 should have some softness to it or otherwise be compressible after its formation on the adhesion layer 202.

The build-up layer 203 should be a dielectric and be capable of being "hardened" after it is initially formed on the adhesion layer 202 in a softened state. Here, again as will be discussed in more detail further below, the hardened build-up layer 203 will remain in the package after production is complete. As such it should be capable of acting as an electric insulator as well as exhibit durability within a finished package. In the case of liquid phase applications of the build-up layer 203 at least, the build-up layer 203 may be cured (e.g., through light stimulation) so that it hardens on the surface of the adhesion layer 202 after application thereto.

Figure 2C:
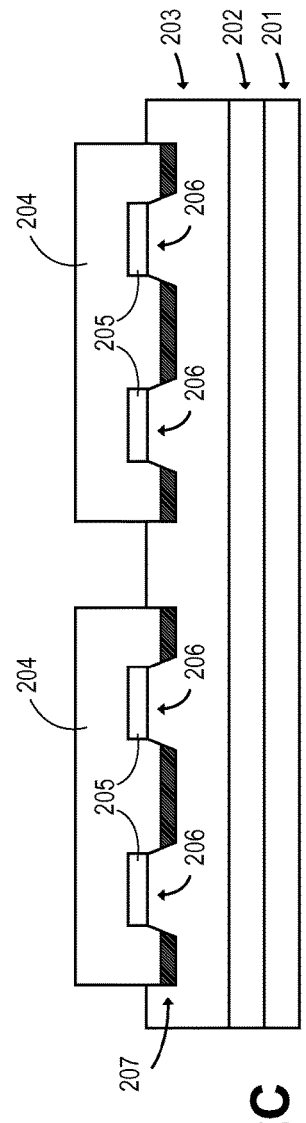

As observed in FIG. 2c, two or more functionally tested semiconductor die 204 having wide pads 205 (e.g., greater than 40 μm across) to facilitate previous functional testing on wafer are pressed (face down) into the build-up layer 203 (e.g., by way of a pick-and-press process) as a manner of attaching the die 204 to the build-up layer/adhesion layer/carrier structure. Here, the aforementioned softness of the build-up layer 203 facilitates the pressing of the die into the build-up layer 203 to adhere them to the build-up layer 203. The build-up layer 203 may even be in the liquid phase during the pressing of the die into the build-up layer 203.

A matter of concern is the degree to which the build-up layer 203 can "fill" the cavity 206 associated with a pad 205 that is recessed into the passivation layer 207 of the die 204 (if the pads are so recessed). Here, an autoclave process may be used to help fill any voids that remain in the cavity 206 after the die 204 have been pressed into the build-up layer 203. An autoclave process increases the atmospheric pressure of the ambient surrounding the structure after the die 204 are initially pressed into the build-up layer 203 so that the soft/liquid build-up layer 203 naturally presses deeper into the cavity 206. In an embodiment, the die 204 are initially pressed into the build-up layer 203 at vacuum atmospheric pressure or thereabouts so that the increased pressure of the autoclave process may be regular atmospheric pressures.

Again, the thickness of the build-up layer 203 may be of some importance in realizing the aforementioned wiring density improvements. Build-up layer 203 thickness is described in more detail further below.

As observed in FIG. 2d, the build-up layer 203 is cured to transition from the softened state that enabled the press attachment of the die 204 to a hardened state that is suitably durable for a finished package structure. Curing may be performed with light illumination and/or with the application of higher temperature depending on the material used for the build-up layer 203.

As observed in FIG. 2e, after the build-up layer 203 is cured, a mold compound or more generally "mold" 208 is applied over the die 204 and exposed areas of the cured build-up layer 203. Part of the molding process includes forming a substantially planar mold surface. The mold 208 may be applied through any of compression molding, transfer molding, injection molding. The mold 208 substance may be highly-filled thermosetting epoxy, In an embodiment, the mold is applied at higher temperatures in a substantially liquid phase. The cured build-up layer 203 should have a melting point/or glass transition temperature that is higher than the temperature of the mold 208 when it is formed over the cured build-up layer 203.

The thickness of the mold 208 should be sufficient to cover the thickest of the die 204. Here, although the figures show multiple die 204 of equal thickness, it is conceivable that the various die 204 will have substantial unequal thickness (e.g., two or more of the die were manufactured from different manufacturing processes). The mold can easily adopt its form to the different die thickness and still be shaped to produce a substantially planar surface 209.

As observed in FIG. 2f the adhesion layer 202 is removed thereby detaching the carrier 201 and leaving the overall structure having the build-up layer 203 as one outer to planar surface and the mold 208 as the other outer planar surface 209. The overall structure is flipped so that the build-up layer 203 surface faces upward to support the following metallization and wiring processes.

The process used to break down the adhesion layer 202 so that the overall structure can be freed from the carrier 201 can be thermally induced (e.g., the adhesion layer 202 will structurally breakdown or change to a liquid phase in response to an elevated temperature), chemically induced (e.g., the adhesion layer 202 has a chemical bond with the carrier and delamination can be made to occur by inducing a chemical process by which the chemical bond is released), mechanically induced (e.g., the adhesion layer 202 is brittle and can be cracked from the carrier, e.g., by inducing warpage into the surface of the carrier), and/or optically induced (e.g., the structural properties of the adhesion layer 202 can be made to change, e.g., by transferring from a solid phase to a liquid phase, in response to being illuminated with light, e.g., through a transparent carrier). In an embodiment, remnants of the adhesion layer 202 are removed from the surface of the build-up layer 203 before the metallization processes begin (e.g., via application of compressed air to the build-up layer surface that was originally in contact with the carrier).

Thus, as of FIG. 2f, a substantially planar surface of the build-up layer 203 is facing upward ready for the metallization process.

Figure 2G:
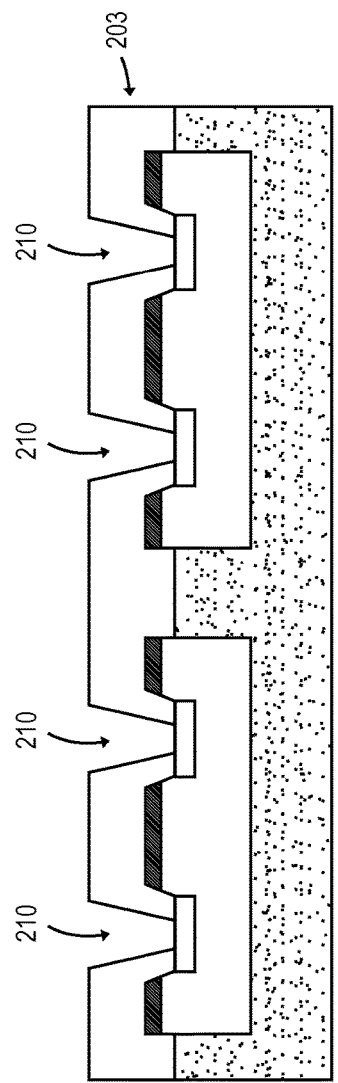

As observed in FIG. 2g, via openings 210 are formed in the build-up layer 203 above the pads 205 of the die 204 (e.g., by way of laser ablation with masks, photoresist-application/patterning/etching, or laser beam drilling). As discussed in more detail below, the via openings 210 are small which permit higher density wiring.

Figure 2H:
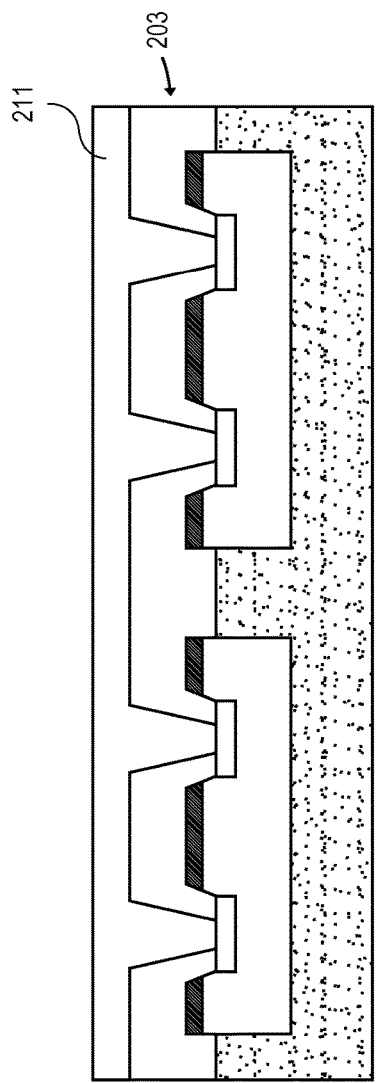

As observed in FIG. 2h a layer of metallization 211 is applied to the surface of the build-up layer 203. The metallization 211 may be applied by a deposition process such as sputtering, plating and printing. Other types of processes that may be used to form the metallization layer 211 include paste printing, sintering, ink jet printing. The metallization layer typically includes at least one of aluminum, nickel, silver, gold and copper.

Figure 1A:
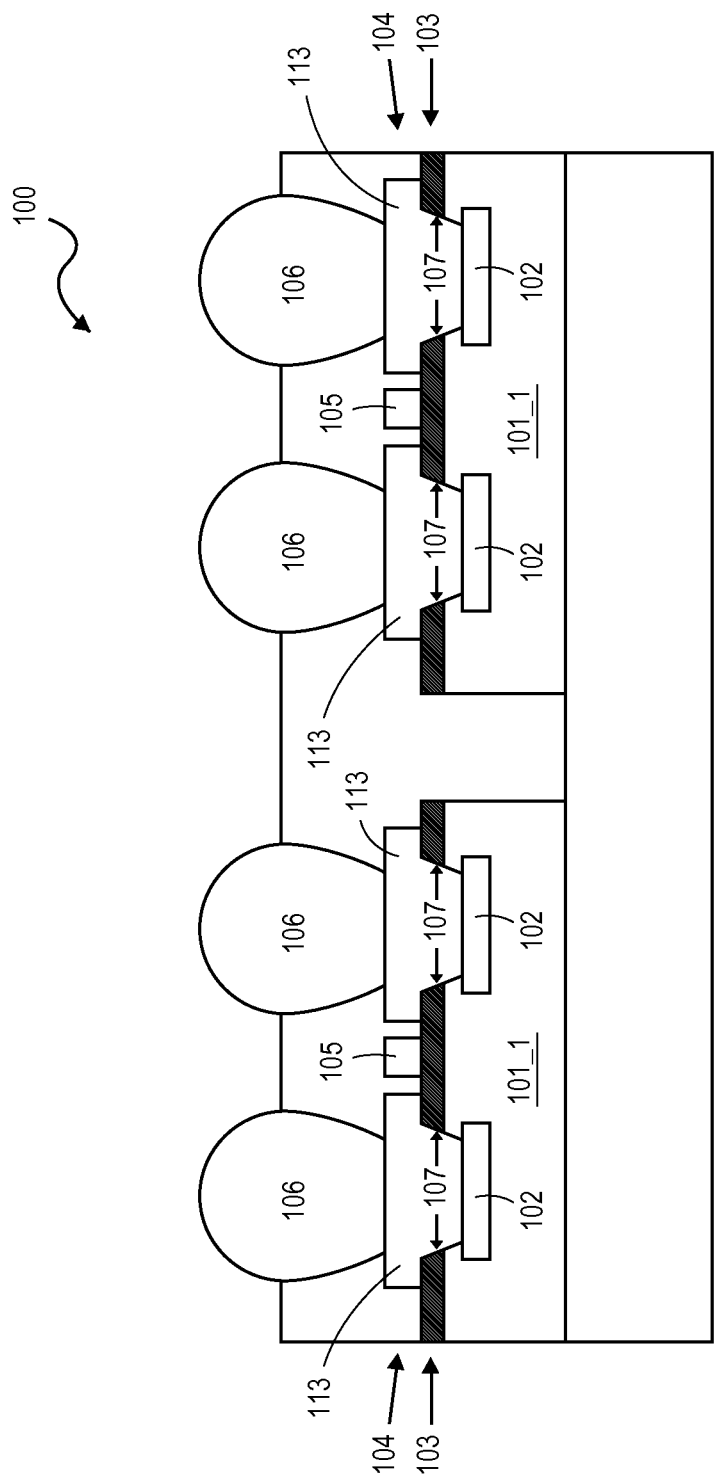

As observed in FIG. 2i the metallization 211 is patterned (e.g., by way of photoresist-application/patterning/etching) to form wiring 212 and lands 213. Notably, multiple wires 212 can be formed between lands 213. Here, in an embodiment where the minimum die pad spacing 217 is 15 μm. Up to 7 wires having a line-width of 3/3 μm can be placed between solder ball 216/lands 213 having a pitch of 55 μm. The table below shows additional examples and a comparison against the prior art approach of FIGS. 1a,b.

| Distance 217 (μm) | Width of pad 205 (μm) | Solder Ball 216 Pitch (center to center distance between neighboring solder balls) (μm) | Width of land 213 (μm) | (Solder ball 216 pitch) − (width of land 213) = edge-to-edge distance between neighboring lands 213 (μm) | Size of single wire 212 (line width/spacing b/w lines) (μm) | # of wires between neighboring lands 213 (improved approach) | # of wires between neighboring lands 213 (prior art) |
|---|---|---|---|---|---|---|---|
| 25 | 40 | 65 | 15 | 50 | 5/5 L/S | 4 | 2 |
| 25 | 40 | 65 | 10 | 55 | 5/5 L/S | 5 | 2 |
| 20 | 40 | 60 | 15 | 45 | 5/5 L/S | 4 | 1 |
| 20 | 40 | 60 | 10 | 50 | 5/5 L/S | 4 | 1 |
| 15 | 40 | 55 | 15 | 40 | 5/5 L/S | 3 | 1 |
| 15 | 40 | 55 | 10 | 45 | 5/5 L/S | 4 | 1 |

| Distance 217 (μm) | Width of pad 205 (μm) | Solder Ball 216 Pitch (center to center distance between neighboring solder balls) (μm) | Width of land 213 (μm) | (Solder ball 216 pitch) − (width of land 213) = edge-to-edge distance between neighboring lands 213 (μm) | Size of single wire 212 (line width/spacing b/w lines) (μm) | # of wires between neighboring lands 213 (improved approach) | # of wires between neighboring lands 213 (prior art) |
|---|---|---|---|---|---|---|---|
| 25 | 40 | 65 | 15 | 50 | 3/3 L/S | 7 | 3 |
| 25 | 40 | 65 | 10 | 55 | 3/3 L/S | 8 | 3 |
| 20 | 40 | 60 | 15 | 45 | 3/3 L/S | 7 | 2 |
| 20 | 40 | 60 | 10 | 50 | 3/3 L/S | 7 | 2 |
| 15 | 40 | 55 | 15 | 40 | 3/3 L/S | 6 | 2 |
| 15 | 40 | 55 | 10 | 45 | 3/3 L/S | 7 | 2 |
| 25 | 40 | 65 | 15 | 50 | 2/2 L/S | 11 | 5 |
| 25 | 40 | 65 | 10 | 55 | 2/2 L/S | 13 | 5 |
| 20 | 40 | 60 | 15 | 45 | 2/2 L/S | 10 | 4 |
| 20 | 40 | 60 | 10 | 50 | 2/2 L/S | 11 | 4 |
| 15 | 40 | 55 | 15 | 40 | 2/2 L/S | 9 | 3 |
| 15 | 40 | 55 | 10 | 45 | 2/2 L/S | 10 | 3 |

Importantly, the wide pads 205 on a same die may be spaced apart 217 a minimal distance permitted by the die's manufacturing process. This results in the formation of the lands 213 formed over a same die being spaced apart at a minimum distance between them as well.

As observed in FIG. 2j, after the wiring layer has been patterned, a dielectric layer 215 is formed over the metallization 211. The dielectric layer 215 is patterned above the lands 213 to form openings in the dielectric layer 215 that expose lands 213. Solder balls or C4 balls 216 are then formed on the exposed lands 213. As an optional process, the package is subsequently sealed (e.g., with a lid that seals the inside of the package hermetically).

Figure 1B:
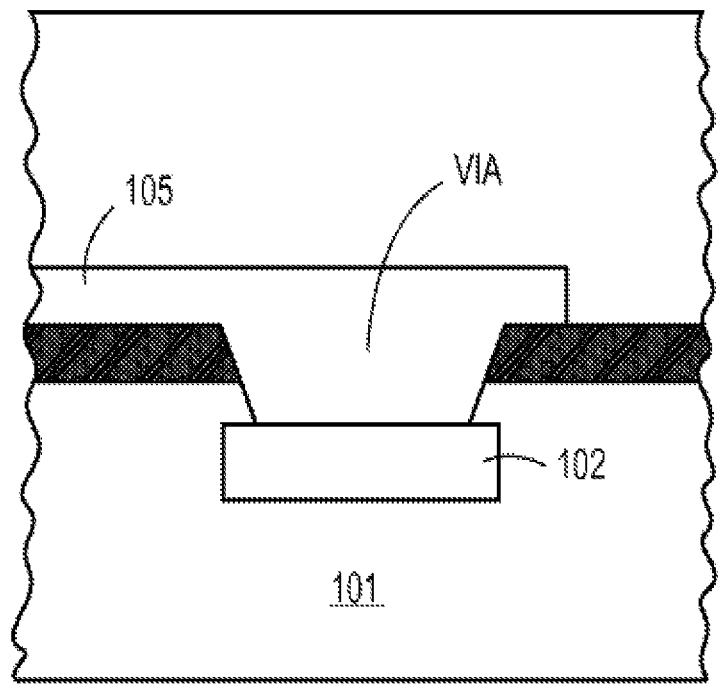

Referring to FIG. 2g through 2j, note that the build up layer 203 allows for the formation of small via openings 210 above the wide pads 205 on die 204. The small via openings 210, in turn, provide for the formation of much smaller lands 213 as compared to the lands 113 observed in the prior art approach of FIG. 1. The smaller lands 213 leave additional planar space where more wires 212 can be packed even though, as discussed above, the wide pads on a same die are spaced apart a minimal distance 217 permitted by the die's manufacturing process and the lands 213 are correspondingly placed a minimum distance apart as well.

With respect to the thickness of the build-up layer 203, on the low end, the build-up layer 203 should be greater than the maximum warpage tolerances of the surface of the die 204 so that the build-up layer 203 is guaranteed to cover the surface of the die 204 when they are pressed into the build-up layer 203. For example, if the die 204 can exhibit as much as 1-2 μm vertical warpage (i.e., two points on the surface of a die can have as much as 1-2 μm of vertical displacement between them), the thickness of the build-up layer should be greater than 1-2 μm.

On the high-end, the dynamics of the formation of the via openings 210 should be taken into account along with the worst case current draw through any via. Generally, the shape of via openings 210 are conical or tapered (that is, the diameter of the via opening continually shrinks moving deeper into the via opening). As such, generally, the smallest width of the via is at the point of contact with pads 205. If the width is too small for the amount of current that is being drawn through the pad and via an electrical failure may result. As such, the thickness of the build-up layer should not exceed a thickness where the bottom of the vias are too narrow for the amount of current that is to be drawn through them.

Note that pads 205 may exhibit some scaring from the probes that previously touched the pads while the testing was being performed on the die before they were packaged.

Figure 2K:
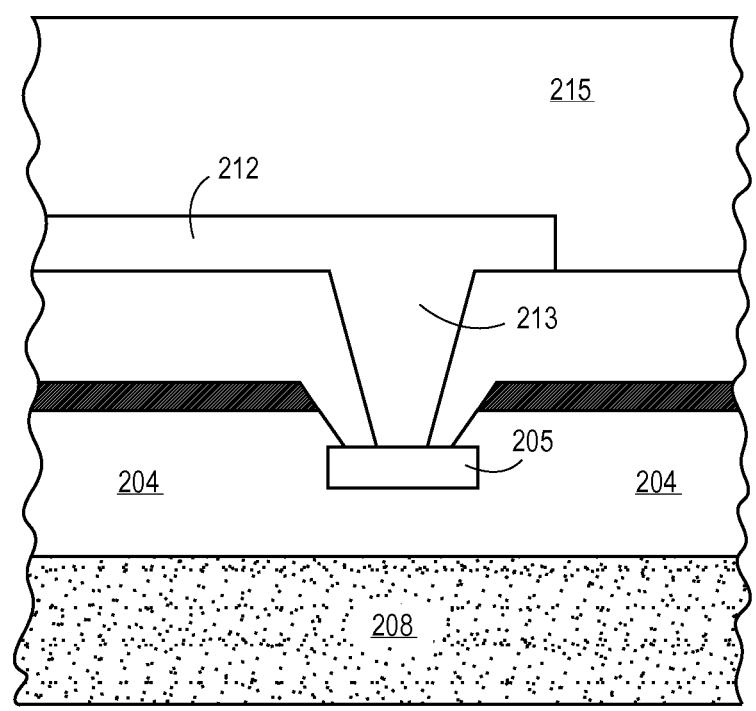

FIG. 2k shows a cross section in a direction orthogonal to the depiction of FIG. 2j to show interconnection of wiring traces 212 to pads 205. Through such interconnection pads of a same die or pads of different die may be connected through wiring traces 212.

Figure 3:
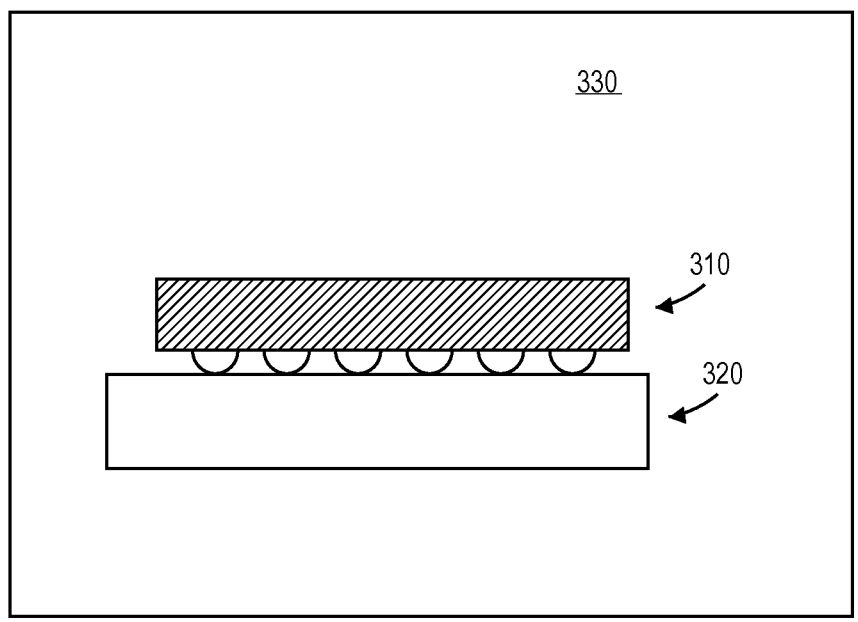
FIG. 3 shows a system having the improved multi-chip package.

FIG. 3 shows the complete package 310 mounted to a planar board 320. Although previous figures depicted only two die in the depicted cross section, it should be understood that more than one die may be enclosed within the package 310. Notably, the different die may include different instances of the same die (e.g., two identically designed memory chips) and/or different instances of different die (e.g., a system on chip die and a dynamic random access memory die). In the case of different instances of different die, the different die may be manufactured according to different manufacturing process technologies (e.g., high density logic, flash, dynamic random access memory, phase change memory and switch).

The planar board 320 and mounted package 310 may be integrated into any larger computing system 330, such as a handheld device (e.g., smartphone), a tablet computer, a laptop computer, a desktop computer or server computer. Likewise the planar board 320 and mounted package 310 may be integrated into other types of electronic equipment such as network routers, network switches, smart devices (e.g., smart-watch, smart-glasses, etc.).

In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative rather than a restrictive sense.

What is claimed is:

1. A method, comprising:
forming a build-up layer on an adhesion layer of a carrier, wherein the build-up layer has a topmost surface and a bottommost surface;
pressing more than one semiconductor die into the build-up layer, wherein each semiconductor die has a topmost surface and a bottommost surface, wherein each semiconductor die having been previously functionally tested and having wide pads to facilitate the testing, wherein, at least some of the wide pads on a same die are spaced apart a minimal distance permitted by said die's manufacturing process, wherein the bottommost surface of the build-up layer is below the topmost surface of each die, and wherein each wide pad is recessed into the die to have the topmost surface lower than the topmost surface of the die;
forming a mold over the more than one semiconductor die;
detaching the build-up layer from the carrier;
removing the build-up layer over the at least some of the wide pads to form via openings over the at least some of the wide pads;
forming a metallization layer on the build-up layer, the metallization layer substantially filling the via openings; and
patterning the metallization to form lands over the filled via openings and more than one wire between respective lands of the at least some of the wide pads.

2. The method of claim 1 further comprising raising the atmospheric pressure around the semiconductor die and build-up layer after the pressing to better fill voids in recessed regions on a die's surface where the die's pads are located.

3. The method of claim 1 further comprising hardening the build-up layer after the forming of the mold.

4. The method of claim 1 wherein the wide pads are each approximately 40 μm across.

5. The method of claim 1 further comprising forming solder balls or C4 balls on the lands.

6. The method of claim 1 wherein the removing of the build-up layer includes use of a laser.

7. An apparatus, comprising:
a build-up layer having a topmost surface, a bottommost surface, and a pad side of multiple die pressed into a bottom side of the build-up layer, wherein each die has a topmost surface and a bottommost surface, wherein the multiple die having wide pads to facilitate on wafer testing of the multiple die, the wide pads spaced a minimum distance permitted by a manufacturing process used to manufacture their respective die, the build-up layer being removed above the wide pads, wherein the bottommost surface of the build-up layer is below the topmost surface of each die, and wherein each wide pad is recessed into the die to have the topmost surface lower than the topmost surface of the die;
metallization on a top side of the build-up layer and substantially filling regions above the wide pads, the metallization including lands above the wide pads and multiple wires between the wide pads.

8. The apparatus of claim 7 wherein the wide pads exhibit scaring from testing of the die prior to their being packaged with the build-up layer and metallization.

9. The apparatus of claim 7 wherein a bottom region of the metallization in contact with the wide pads has a width sufficient to withstand a maximum rated current flow through said wide pads.

10. The apparatus of claim 9 wherein a thickness of the build-up layer provides for said width in view of tapering along sidewalls of said build-up layer around said regions.

11. The apparatus of claim 7 wherein said build-up layer is selected from the group consisting of: polyimide; epoxy; acrylic; a low k material; silicone; PBO.

12. The apparatus of claim 7 further comprising dielectric formed over the build-up layer and the metallization.

13. The apparatus of claim 12 further comprising openings formed in the dielectric above the lands and solder balls or C4 balls formed on the lands.

14. A system, comprising:
a planar board,
a multi-chip module affixed to the planar board, the multi-chip module comprising:
a build-up layer having a pad side of multiple die pressed into a bottom side of the build-up layer, wherein each die has a topmost surface and a bottommost surface, wherein the multiple die having wide pads to facilitate on wafer testing of the multiple die, the wide pads spaced a minimum distance permitted by a manufacturing process used to manufacture their respective die, the buildup layer being removed above the wide pads, wherein the bottommost surface of the build-up layer is below the topmost surface of each die, and wherein each wide pad is recessed into the die to have the topmost surface lower than the topmost surface of the die;
metallization on a top side of the build-up layer and substantially filling regions above the wide pads, the metallization including lands above the wide pads and multiple wires between the wide pads.

15. The system of claim 14 wherein the wide pads exhibit scaring from testing of the die prior to their being packaged with the build-up layer and metallization.

16. The system of claim 14 wherein the wide pads exhibit scaring from testing of the die prior to their being packaged with the build-up layer and metallization.

17. The system of claim 14 wherein a bottom region of the metallization in contact with the wide pads has a width sufficient to withstand a maximum rated current flow through said wide pads.

18. The system of claim 14 wherein said system is a computing system.

19. The system of claim 18 wherein said computing system is any of: an intelligent device; a smartphone; a tablet computer; a laptop computer; a desktop computer; a server computer.

20. The apparatus of claim 14 wherein said system is a networking system.

21. A method, comprising:
forming a build-up layer on an adhesion layer of a carrier;
pressing more than one semiconductor die into the build-up layer, each semiconductor die having been previously functionally tested and having wide pads to facilitate the testing, wherein, at least some of the wide pads on a same die are spaced apart a minimal distance permitted by said die's manufacturing process, wherein the bottommost surface of the build-up layer is below the topmost surface of each die, and wherein each wide pad is recessed into the die to have the topmost surface lower than the topmost surface of the die;

forming a mold over the more than one semiconductor die;

detaching the build-up layer from the carrier;

removing the build-up layer over the at least some of the wide pads to form via openings over the at least some of the wide pads;

forming a metallization layer on the build-up layer, the metallization layer substantially filling the via openings; and patterning the metallization to form lands over the filled via openings and more than one wire between respective lands of the at least some of the wide pads, wherein at least one or more wires are spaciously formed between a land of a first die and another land of a second die.

* * * * *